United States Patent
Lu et al.

(10) Patent No.: US 7,235,496 B2
(45) Date of Patent: Jun. 26, 2007

(54) HDPCVD PROCESS AND METHOD FOR IMPROVING UNIFORMITY OF FILM THICKNESS

(75) Inventors: Chien-Hung Lu, Hsinchu (TW); Chin-Ta Su, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/711,512

(22) Filed: Sep. 23, 2004

(65) Prior Publication Data

US 2006/0063390 A1    Mar. 23, 2006

(51) Int. Cl.
*H01L 21/31* (2006.01)

(52) U.S. Cl. ...................................... 438/758

(58) Field of Classification Search .............. 438/785, 438/745, 706, 680, 50.1, 50, 758
See application file for complete search history.

(56) References Cited

U.S. PATENT DOCUMENTS 6,770,565 B2 *  8/2004  Olgado et al. .............. 438/706

* cited by examiner

*Primary Examiner*—Carl Whitehead, Jr.
*Assistant Examiner*—Monica D. Harrison
(74) *Attorney, Agent, or Firm*—Jiang Chyun IP Office

(57) ABSTRACT

A high density plasma chemical vapor deposition (HD-PCVD) process is disclosed. First, a first deposition step is performed on a wafer. Then, the wafer is rotated with an angle. A second deposition step is performed for completing the deposition. By the rotation of the wafer, the thin film is formed with a desired uniformity.

14 Claims, 1 Drawing Sheet

HDPCVD PROCESS AND METHOD FOR IMPROVING UNIFORMITY OF FILM THICKNESS

BACKGROUND OF THE INVENTION

1. Field of the Invention

The present invention relates to a semiconductor process, and more particularly to a high density plasma chemical vapor deposition process and a method for improving uniformity of thickness of a thin film.

2. Description of the Related Art

In semiconductor manufacturing process, chemical vapor deposition (CVD) is a widely used technique for forming thin films. It usually includes atmospheric CVD (APCVD), low pressure CVD (LPCVD), plasma enhanced CVD (PECVD) and high density plasma CVD (HDPCVD). The film formed by HDPCVD is denser, more capable of preventing moisture penetration and more uniform than those formed by the other techniques. With the advancement of semiconductor technology, devices in integrated circuits becomes more compact. The gap-fill ability of HDPCVD for devices is better than those of the other techniques. Accordingly, HDPCVD has become a core technique for submicron semiconductor technology.

HDPCVD process should be performed at the deposition systems in the reaction chambers. During a thin film deposition, reaction gases are released from gas output holes and diffuse to the wafer for forming a thin film thereon. For example, a deposition system manufactured by Novellus, Corp. comprises eight gas output holes. These gas output holes are allocated in the chamber around the wafer. During the thin film deposition, reaction gases are released from these eight gas output holes for forming the thin film on the wafer.

Due to different distances from these gas output holes to different areas of the wafer, the thickness of the thin film formed by the deposition system manufactured by Novellus Corp. is not uniform at the edge of the wafer, i.e. near to these gas output holes. The non-uniformity of thickness results in wave patterns at the edge of the wafer as shown in FIG. 1. The reason of causing the wave patterns is that the reaction gases cannot uniformly diffuse to different areas of the wafer and the non-uniformity leads to different accumulations of the reaction gases on different areas of the wafer. Accordingly, a thinner film is formed along the direction 100 of the gas output holes as shown in FIG. 1. A thicker film, however, is formed on the other areas 102 as shown in FIG. 1. The wave-pattern issue becomes worsen at the region closer to these gas output holes. The wave-pattern issue causes non-uniformity of thickness of the thin film and affects the characteristics of the thin film.

SUMMARY OF THE INVENTION

Accordingly, the present invention is directed to a high density plasma chemical vapor deposition (HDPCVD) process for resolving the issue of non-uniformity of thickness occurred at the edges of wafers.

The present invention also directed to a HDPCVD process for resolving the issue of non-uniformity of thickness occurred at the edges of wafers.

The present invention also directed to a method for improving uniformity of thickness of a thin film for resolving the issue of non-uniformity of thickness occurred at the edges of wafers.

The present invention discloses a HDPCVD process. First, a first deposition step is performed on a wafer, and then the wafer is rotated with an angle. A second deposition step is performed for completing a thin film deposition. The thin film has a uniform thickness. The deposition system, which is used to deposit the thin film, comprises n gas output holes. Performing the first and the second deposition steps requires a time interval. At ½ of the time interval, the wafer is rotated at an angle of 360/2n degrees, wherein n is an integer.

The present invention discloses another HDPCVD process. First, a first deposition step is performed on a wafer, and then the wafer is rotated with an angle. A second deposition step is performed for completing a thin film deposition. The thin film has an uniform thickness. The deposition system, which is used to deposit the thin film, comprises n gas output holes. Performing the first and the second deposition steps requires a time interval. At 1/m of the time interval, the wafer is rotated at the angle of 360/(m*n) degrees, wherein m and n are integers.

The present invention discloses a method for improving uniformity of thickness of a thin film. The method is adapted for a chemical vapor deposition process. The method forms the thin film with a uniform thickness by rotating the wafer at an angle while depositing the thin film on the wafer.

Due to the rotation of the wafer while depositing the thin film thereon, the present invention forms a thicker film on the part of the wafer where a thinner film would be formed and a thinner film on the part of the wafer where a thicker film would be formed. Accordingly, the method can uniformly deposit the thin film on the wafer.

In order to make the aforementioned and other objects, features and advantages of the present invention understandable, a preferred embodiment accompanied with figures is described in detail below.

DESCRIPTION OF SOME EMBODIMENTS

The present invention discloses a method for improving uniformity of thickness of a thin film. The method is adapted for a chemical vapor deposition process. The method first performs a first deposition step on a wafer. The method forms the thin film with a uniform thickness by rotating a wafer at an angle, relative to the stationary position, while depositing the thin film on the wafer. The angle with which the wafer rotates depends on, for example, the number of gas output holes around the wafer. If a process time is required to deposit the thin film, the time of rotating the wafer is 1/m of the process time, wherein m is an integer. For example, when the process time is t, at t/2, the wafer is rotated for 360/2n degrees, wherein n is the number of the gas output holes and an integer. The deposition of thin film is then continued. With the rotation of the wafer, a thicker film can be deposited on the portion of the wafer where a thinner film would be formed due to the non-uniform diffusion of the reaction gas. In contrast, a thinner film can be deposited on the portion of the wafer where a thicker film would be formed. As a result, the thickness of the deposited film becomes uniform.

Following are the descriptions of the application of the HDPCVD process described above. The present invention, however, is not limited thereto.

The HDPVCD process is performed at the deposition system in the HDPVCD chamber. The deposition system is, for example, a deposition system manufactured by Novellus Corp. with eight gas output holes. These gas output holes are allocated at intervals in the chamber around the wafer.

Figure 1:
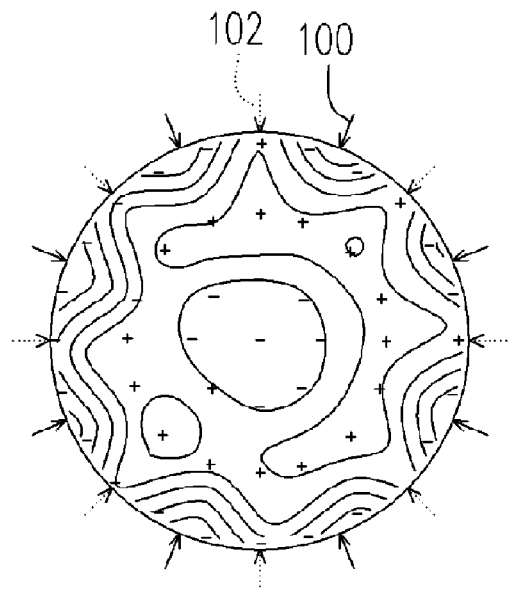
FIG. 1 is a schematic top view showing a thickness distribution of a film formed according to a prior art process.
Figure 2:
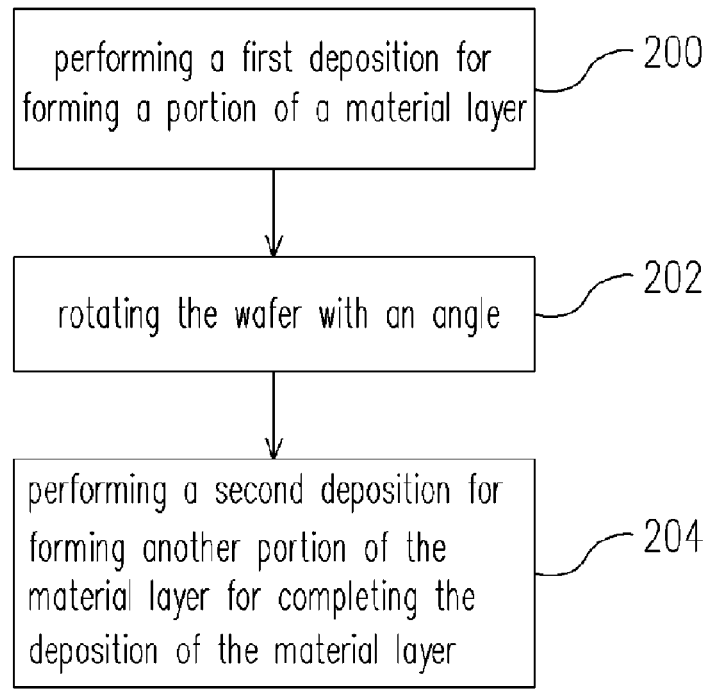
FIG. 2 is a flowchart showing a HDPCVD process according to the present invention.

FIG. 2 is a flowchart showing a HDPCVD process according to the present invention. Referring to FIG. 2, a first deposition step is performed for forming a portion of a material layer on a wafer in step 200. The material layer comprises a dielectric layer, such as silicon oxide.

The wafer is rotated at an angle along an axis which is perpendicular to the plane of the wafer in step 202. The angle depends on, for example, the number of gas output holes around the wafer. If a process time is required to deposit the thin film, the time for rotating the wafer is 1/m of the process time and m is an integer. For example, when the process time is t, at t/m, the wafer should be rotated for 360/(m*n) degrees, wherein n is the number of the gas output holes and an integer. In this embodiment, the deposition system manufactured by Novellus Corp. comprises eight gas output holes. At a half of the process time, the wafer rotates at an angle of 22.5 degrees.

A second deposition step is performed for forming another portion of the material layer on the wafer for completing the deposition of the material layer in step 204. In step 200, the first deposition step results in a non-uniform material layer on the wafer. After the rotation step 202 and the second deposition step 204, a thicker film can be deposited on the portion of the wafer where a thinner film would be formed due to the non-uniform diffusion of the reaction gas. In contrast, a thinner film can be deposited on the portion of the wafer where a thicker film would be formed due to the non-uniform diffusion of the reaction gas. Accordingly, the non-uniformity issue of film thickness can be resolved.

In one embodiment, if these steps 200, 202 and 204 constitute a deposition cycle, the material layer can be formed by repeating the deposition cycle at least once. In other words, the rotation of the wafer may be conducted for several cycles during the deposition of the material layer. With the rotation of the wafer, the deposited film becomes uniform.

Due to the rotation of the wafer while depositing the thin film thereon, the present invention forms a thicker film on the portion of the wafer where a thinner film would be formed and a thinner film on the portion of the wafer where a thicker film would be formed. Accordingly, the thin film can uniformly deposit on the wafer according to the method of the present invention.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A high density plasma chemical vapor deposition (HDPCVD) process, comprising:
   performing a first deposition step on a wafer;
   rotating the wafer with an angle; and
   performing a second deposition step for completing a thin film deposition, the thin film having a uniform thickness, wherein a deposition system is adapted to deposit the thin film comprises n gas output holes, wherein the first and the second deposition steps require a time interval, and at one half of the time interval, the wafer is rotated at the angle of 360/2n degrees, and n is an integer.

2. The HDPCVD process of claim 1, wherein the deposition system comprises eight output holes and the angle is 22.5 degrees.

3. The HDPCVD process of claim 1, wherein the first and the second deposition steps constitute a deposition cycle, the process further comprising:
   repeating the deposition cycle at least once.

4. The HDPCVD process of claim 3, wherein the deposition system comprises eight output holes and the angle is 22.5 degrees.

5. A high density plasma chemical vapor deposition (HDPCVD) process, comprising:
   performing a first deposition step on a wafer,
   rotating the wafer with an angle; and
   performing a second deposition step for completing a thin film deposition, the thin film having a uniform thickness, wherein a deposition system is adapted to deposit the thin film comprises n gas output holes, and performing the first and the second deposition steps require a time interval, wherein at 1/m of the time interval, the wafer is rotated at the angle of 360/(m*n) degrees, and m and n are integers.

6. The HDPCVD process of claim 5, wherein the wafer is rotated with the angle at one half of the time.

7. The HDPCVD process of claim 6, wherein the deposition system comprises eight output holes and the angle is 22.5 degrees.

8. The HDPCVD process of claim 5, wherein the first and the second deposition steps constitute a deposition cycle, the process further comprising:
   repeating the deposition cycle at least once.

9. The HDPCVD process of claim 8, wherein he wafer is rotated with the angle at one half of the time.

10. The HDPCVD process of claim 9, wherein the deposition system comprises eight output holes and the angle is 22.5 degrees.

11. A method for improving uniformity of thickness of a thin film, adapted for a high density plasma chemical vapor deposition process, comprising:
    forming the thin film with uniform thickness by rotating a wafer with an angle while depositing the thin film on the wafer, wherein a deposition system adapted to deposit the thin film comprises n gas output holes and depositing the thin film on the wafer requires a time, the wafer being rotated an angle with 360/(m*n) at 1/m of the time, m and n being integers.

12. The method for improving uniformity of thickness of a thin film of claim 11, wherein at 1/2 of the time, the wafer is rotated with the angle.

13. The method for improving uniformity of thickness of a thin film of claim 12, wherein the deposition system comprises eight output holes and the angle is 22.5 degrees.

14. The method for improving uniformity of thickness of a thin film of claim 11, wherein the chemical vapor deposition process comprises a high density plasma chemical vapor deposition (HDPCVD) process.

* * * * *